(12) United States Patent
Hammes

(10) Patent No.: US 7,502,435 B2
(45) Date of Patent: Mar. 10, 2009

(54) TWO-POINT MODULATOR ARRANGEMENT AND USE THEREOF IN A TRANSMISSION ARRANGEMENT AND IN A RECEPTION ARRANGEMENT

(75) Inventor: Markus Hammes, Dinslaken (DE)

(73) Assignee: Infineon Technologies AG, Munich (DE)

( * ) Notice: Subject to any disclaimer, the term of this patent is extended or adjusted under 35 U.S.C. 154(b) by 957 days.

(21) Appl. No.: 10/879,431

(22) Filed: Jun. 29, 2004

(65) Prior Publication Data

US 2005/0041755 A1     Feb. 24, 2005

(30) Foreign Application Priority Data

Jul. 8, 2003     (DE) ................. 103 30 822

(51) Int. Cl.
*H03D 3/24* (2006.01)
*H03L 7/08* (2006.01)

(52) U.S. Cl. ...................... 375/376; 327/156

(58) Field of Classification Search ................. 375/327, 375/374, 376; 327/147, 148, 150, 151, 156, 327/157, 160
See application file for complete search history.

(56) References Cited

U.S. PATENT DOCUMENTS 5,983,077 A * 11/1999 Dent .......................... 455/44

| | | | |
|---|---|---|---|
| 6,515,553 B1 * | 2/2003 | Filiol et al. ................. 332/127 |
| 6,844,763 B1 * | 1/2005 | Balboni ...................... 327/159 |
| 7,154,347 B2 * | 12/2006 | Grewing et al. ............... 331/23 |
| 7,242,229 B1 * | 7/2007 | Starr et al. ................... 327/156 |
| 2003/0174026 A1 * | 9/2003 | Adachi et al. ............... 332/117 |
| 2004/0036539 A1 * | 2/2004 | Hammes et al. ............... 331/16 |
| 2004/0115502 A1 * | 6/2004 | Fukuda et al. ................ 429/33 |
| 2004/0196924 A1 * | 10/2004 | Wilson ....................... 375/302 |

FOREIGN PATENT DOCUMENTS

| | | |
|---|---|---|
| CN | 1265785 A | 9/2000 |
| DE | 199 29 167 A1 | 12/2000 |
| EP | 0 961 412 A1 * | 12/1999 |
| WO | WO 02/099961 A2 | 12/2002 |

* cited by examiner

*Primary Examiner*—Young T. Tse
(74) *Attorney, Agent, or Firm*—Eschweiler & Associates, LLC

(57) ABSTRACT

The present invention provides a two-point modulator arrangement with a PLL that can be operated at various reference frequencies. A modulation signal provided by a digital signal processor is supplied as an analog signal at the input of the oscillator in the PLL and as a digital modulation signal on a frequency divider. For the purpose of pulse shaping the digital modulation data, a digital filter is provided that is coupled to the control input of the frequency divider and, in line with the principle proposed, is operated at the same, constant clock frequency as the signal processor, regardless of the reference frequency. As a result, no resynchronization of the digital modulation data is necessary upstream of the digital filter.

9 Claims, 1 Drawing Sheet

TWO-POINT MODULATOR ARRANGEMENT AND USE THEREOF IN A TRANSMISSION ARRANGEMENT AND IN A RECEPTION ARRANGEMENT

REFERENCE TO RELATED APPLICATIONS

This application claims the benefit of the priority date of German application DE 103 30 822.9, filed on Jul. 8, 2003, the contents of which are herein incorporated by reference in their entirety.

FIELD OF THE INVENTION

The present invention relates to a two-point modulator arrangement and also to the use of the two-point modulator arrangement in a radio-frequency transmission arrangement and in a radio-frequency reception arrangement.

BACKGROUND OF THE INVENTION

In transmission arrangements, for example for mobile radio, a modulation signal firstly needs to be modulated onto a radio-frequency carrier and secondly the carrier frequency needs to be stabilized and adjustable.

One possible way of doing this is provided by a phase locked loop, a PLL, which is firstly used as a frequency synthesizer and secondly has the modulation signal introduced into it. The modulation signal can be fed in at different points in the PLL, with an implicit high-pass filter or low-pass filter response being obtained on the basis of the connection point for the modulation signal.

The document DE 199 29 167 specifies a modulator and a method for phase or frequency modulation with a PLL circuit, where the modulation signal is introduced at a point in the PLL at which a high-pass filter response is obtained for the modulation frequency, and at the same time is introduced at a further point in the PLL, at which a low-pass filter response is obtained. Such a modulator is also referred to as a two-point modulator. Normally, the modulation signal is impressed on the input of the oscillator in the PLL in digital form, by varying the division ratio for the frequency divider in the PLL, and at the same time in analog form.

A fundamental advantage of such two-point modulation is that the bandwidth of the control loop can be designed to be much smaller than transfer of the modulated data actually requires. This results in advantages in terms of the noise response. In addition, in contrast to "open loop" designs, in which the control loop is opened as soon as the PLL has locked onto the desired carrier frequency, the control loop may also remain closed during the modulation.

Besides purely digital modulation over the variation in the division ratio of the frequency divider with a small bandwidth, the two-point modulator design involves the analog modulation at the oscillator input being used to compensate for the limited bandwidth.

In the case of the two-point modulation, particular attention needs to be paid to phase equality for the analog and digital modulation data which are fed into the PLL. In addition, it is necessary to ensure a good match between the amplitudes of the two modulation signals.

Drawbacks of the two-point modulator design become apparent, however, when this design is intended to be used in "multiple clock" systems. Such systems occur in modern mobile radio systems, for example in "dual band" or "triband" appliances and also in multimode appliances. These appliances can be operated either in various frequency bands or even using various mobile radio standards, such as GSM (Global System for Mobile Communication), and UMTS (Universal Mobile Telecommunication Standard).

The modulation data to be transmitted are normally conditioned in a digital signal processor, which may comprise blocks for protocol processing and one or more processors, for example. The output signal from the digital signal processor is normally routed via a digital filter which performs any signal shaping which is required for the bits that are to be transmitted, for example Gaussian filtering in the case of Gaussian frequency shift keying. The output data from the digital filter may be routed to the frequency divider via a digital sigma-delta modulator, for example, which means that a fractional rational division ratio is obtained on average over time. In addition, the digital modulation signal is routed to the input of the controlled oscillator in the PLL via an analog filter, a digital/analog converter or the like in the form of an analog modulation signal.

The digital signal processor and the digital filter at the output of the signal processor are normally designed for a particular clock frequency. This clock frequency firstly stipulates the timing for the protocol sequence, but secondly stipulates the response of the digital filter as well. For the purpose of pulse shaping in the digital filter, a particular ratio between the bit clock and the clock frequency of the digital signal processor is assumed, for example, and in line with this ratio, by way of example, a "state machine" is implemented in the signal processor, which state machine outputs the respective amplitude values of the modulation signal to be transmitted for the various changes in the digital clock.

The digital sigma-delta modulator also effects "noise shaping", i.e. shifts all of the noise in a distribution over the frequency range and into uncritical ranges. The output signal from the sigma-delta modulator is routed to the frequency divider in the radio-frequency PLL and hence is subjected to low-pass filtering implicitly in relation to the radio-frequency output on the oscillator in the PLL. In this scenario, the sigma-delta modulator is operated at the same reference frequency as is also used as the reference frequency for the PLL, to be more precise for the phase comparator or phase detector.

For this constant reference frequency, which serves as reference frequency for the PLL and also as clock frequency for the digital signal processor, including the digital filter, the overall system is produced permanently once. If the PLL is intended to be operated at various reference frequencies, however, for example in a multiple clock system as explained above, then the problem arises that the clock frequency needs to be constant for the digital signal processor nevertheless so that the time base for the protocol processing does not change at various reference frequencies.

This could be done, by way of example, by virtue of a further synthesizer being provided which derives the clock frequency for the digital signal processor from the reference frequency and always provides a constant clock frequency regardless of a varying reference frequency.

On account of the spectral purity demanded, the PLL itself which forms the two-point modulator needs to be operated directly at the reference frequency, however. It is thus also necessary to operate any digital sigma-delta modulator provided at this reference frequency.

What is problematical is therefore transferring the modulation data from the digital signal processor, which needs to be operated at a constant frequency, to the digital sigma-delta modulator or to the frequency divider in the radio-frequency PLL, which in turn need to be operated at a variable reference frequency.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

It is an object of the present invention to specify a two-point modulator arrangement which is suitable for operation at different reference frequencies.

The invention achieves the object with a two-point modulator arrangement that includes a phase comparator having two inputs, one of which is connected to a reference frequency input, and having an output to which a controlled oscillator is connected. In addition, the arrangement includes a frequency divider having an adjustable division ratio that connects an output of the controlled oscillator to an input of the phase comparator, and a digital signal processor having a clock input that is connected to the reference frequency input via a frequency generation block. The digital signal processor also has an output for providing digital modulation data that is coupled to the input of the controlled oscillator and to a control input on the frequency divider. The arrangement further includes a digital filter that couples the output of the digital signal processor to the control input of the frequency divider and has a clock input that is connected to an output of the frequency generation block.

In accordance with the proposed principle, the digital filter is supplied with the same clock frequency as is also used to actuate the digital signal processor, namely with the output frequency from the frequency generation block. Accordingly, there is advantageously no resynchronization of the modulation data necessary between the digital signal processor and the digital filter. The digital filter can accordingly be designed uniquely for the constant clock frequency that is output by the frequency generation block. By contrast, the phase comparator in the phase locked loop is actuated using the reference frequency that is applied to the reference frequency input and which may vary on the basis of the mobile radio mode of operation used or the mobile radio band within the context of a multiple clock system.

The protocol processing in the digital signal processor and the conditioning of the modulation signal in the digital filter are advantageously independent of the reference frequency of the PLL, which comprises the phase comparator, the frequency divider and the controlled oscillator. Since the radio-frequency PLL proposed is operated directly at the reference frequency, a high level of spectral purity is obtained.

Preferably, a sigma-delta modulator is provided that is connected to the control input of the frequency divider. A synchronization unit is connected between the output of the digital filter and an input on the sigma-delta modulator. The sigma-delta modulator has a clock input that is connected to the clock input of the phase comparator, so that the digital sigma-delta modulator is operated at the same reference frequency as the radio-frequency PLL.

The bandwidth of the control loop is preferably designed to be much smaller than the bandwidth of the digital modulation data at the output of the digital filter. This is advantageous because resynchronizing the data from the clock frequency of the digital signal processor and the digital filter to the reference frequency involves supplying samples of the digital modulation to the sigma-delta modulator twice or a plurality of times or else omitting some samples. Advantages are also obtained with respect to the noise response.

The present principle may be used for any reference frequency and clock frequency circumstances.

The synchronization unit samples the output data from the digital signal processor downstream of the digital filter at the clock rate of the reference frequency for the control loop, said output data being generated at the frequency generation block's clock rate. On the basis of the two different frequencies, depending on the phases of the two clocks, the values from the digital filter may appear twice or a plurality of times at the output of the synchronization unit, or some values at the output of the digital filter are omitted or appear unchanged. The two different frequencies mean that the phase generally changes over time. If it is assumed, by way of example, that both the clock rate for the frequency generation block and the clock rate of the reference frequency are high as compared with the bandwidth of the control loop, then "jitter" over time arises and, as a result, multiple or omitted samples are interpolated or are situated outside of the control loop's bandwidth.

If, in one development of the invention, the analog modulation signal is also derived from a "state machine" that actuates current sources, for example, then this state machine can preferably likewise be operated at the clock frequency, that is to say the output frequency from the frequency generation block. Hence, no resynchronization at all is necessary, since the analog signal is supplied directly or via an analog filter to the VCO input of the radio-frequency PLL.

The two-point modulator described can preferably be used in radio-frequency transmission arrangements, particularly in a mobile radio. In that case, the modulator is used to generate a carrier frequency and also to modulate the carrier with a digital baseband signal.

Such a two-point modulator may also preferably be used in a radio receiver, namely as a local oscillator, if the impressed modulation is chosen to be constant in this case. In this context, the modulator actuates a downward frequency converter which down-converts a radio-frequency received signal into an intermediate frequency or to baseband.

Further particulars and advantageous refinements are the subject matter of the subclaims.

BRIEF DESCRIPTION OF THE DRAWINGS

The invention is explained in more detail below using an exemplary embodiment with reference to the drawing, in which.

DETAILED DESCRIPTION OF THE INVENTION

Figure 1:
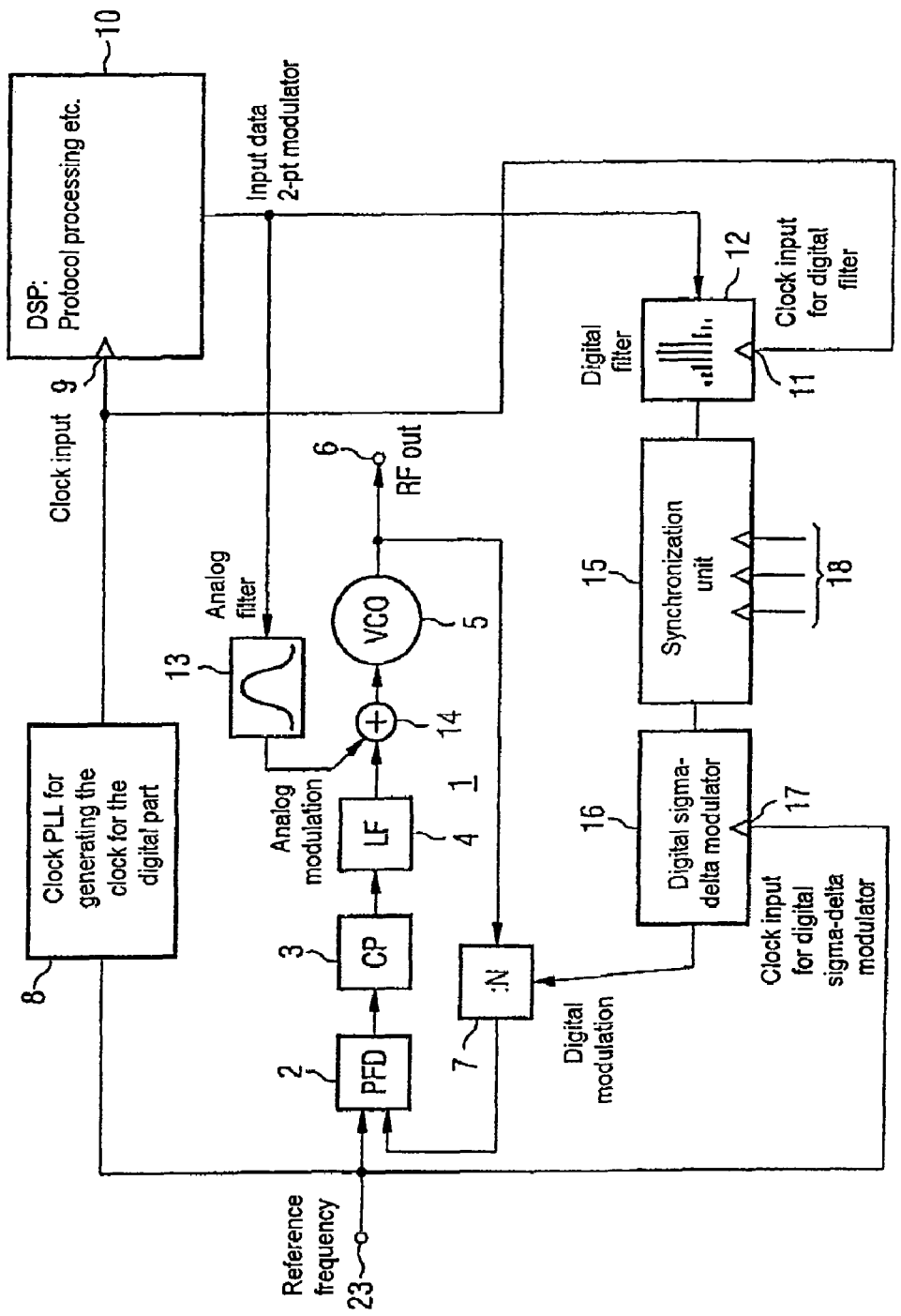
FIG. 1 illustrates a block diagram of an exemplary two-point modulator in line with the proposed principle of the present invention.

FIG. 1 shows a two-point modulator arrangement which comprises a phase locked loop 1, a PLL. The PLL in turn has a phase comparator 2 which has a first input and a second input. The first input of the phase comparator 2, which is in the form of a phase/frequency detector, is connected to a reference frequency input 23. The output of the phase comparator 2 is routed via a charge pump circuit 3, a loop filter 4 connected downstream thereof and an adding node 14, one of whose inputs is connected to the output of the loop filter 4, to the control input of a voltage controlled oscillator 5, a VCO. The output of the oscillator 5 forms the output 6 of the two-point modulator arrangement, at which point it is possible to tap off a modulated radio-frequency signal. The output of the oscillator is also routed via a frequency divider 7, which is in the form of a fractional N divider, to the second input of the phase detector 2 to form a feedback loop.

The reference frequency input 23 is also connected to an input on a frequency generation block 8, which is likewise in the form of a PLL and generates the clock for the digital part of the circuit. The output of the frequency generation block 8 is firstly connected to the clock input 9 of a digital signal processor 10 and secondly to the clock input 11 of a digital filter 12.

The digital signal processor 10, which is designed for conditioning the modulation data, has an output that simultaneously forms the modulation input of the two-point modulator. The output of the digital signal processor 10 is connected to respective inputs of an analog filter 13 and the digital filter 12. The output of the analog filter 13, which converts the digital modulation data into an analog modulation signal, is connected to a further input on the adding node 14, that is connected between the loop filter 4 and the oscillator input of the oscillator 5. The analog modulation point thus has a high-pass filter response for the modulation frequency. The output of the digital filter 12 is connected via a synchronization unit 15 to an input on a digital sigma-delta modulator 16, whose output is in turn connected to a control input on the fractional N frequency divider 7. The modulation in the feedback path of the PLL, namely on the frequency divider 7, is effected with a low-pass filter response in relation to the modulation frequency.

The clock input 17 of the digital sigma-delta modulator 16 is connected to the reference frequency input 23, which means that the phase comparator 2, the frequency generation block 8 and the sigma-delta modulator 16 are operated at the same reference frequency. The synchronization unit 15 prompts the modulation data, which are clocked using the digital clock generated by the frequency generation block 8, to be converted into a modulation data stream that is at the reference frequency of the PLL 1. The synchronization unit 1 5 has a plurality of clock inputs 1 8 for supplying any clock signals required for resynchronizing the modulation signal.

In the case of the two-point modulator described, the digital filter 12 is operated at the same clock frequency as the digital signal processor 10, which means that no resynchronization of the data is necessary between these two blocks. The common clock frequency of the signal processor 10 and the digital filter 12 is constant, regardless of the varying reference frequency 23 of the PLL 1. As a result, the digital filter 12 needs to be designed merely uniquely for the clock frequency that is generated by the frequency generation block 8 and that clock frequency is independent of the reference frequency at the input 23 of the arrangement. The output data from the digital filter 12 can advantageously be resynchronized to the reference clock for the sigma-delta modulator 16 particularly easily by the synchronization circuit 15.

The two-point modulator architecture described ensures that a close pairing for the phase and amplitude of the analog modulation signal at the adding node 14 and of the digital modulation signal at the input of the frequency divider 7 is ensured.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

LIST OF REFERENCE NUMERALS

1 Radio-frequency PLL
2 Phase comparator
3 Charge pump
4 Loop filter
5 Oscillator
6 Radio-frequency output
7 Frequency divider
8 Frequency generation block, clock PLL
9 Clock input
10 Digital signal processor
11 Clock input
12 Digital filter
13 Analog filter
14 Adding node
15 Synchronization unit
16 Digital sigma-delta modulator
17 Clock input
18 Clock inputs
23 Reference frequency input

The invention claimed is:

1. A two-point modulator arrangement, comprising:
a phase comparator comprising two inputs, wherein a first input is connected to a reference frequency input, and comprising an output coupled to an input of a controlled oscillator;
a frequency divider comprising an adjustable division ratio associated therewith coupled to an output of the controlled oscillator to a second input of the phase comparator;
a digital signal processor comprising a clock input coupled to the reference frequency input through a frequency generation block, the digital signal processor further comprising an output providing digital modulation data that is used for modulation at the input of the controlled oscillator; and
a digital filter configured to couple the output of the digital signal processor to a control input of the frequency divider, and comprises a clock input that is coupled to an output of the frequency generation block;
a sigma-delta modulator coupled between the control input of the frequency divider and the digital filter, wherein the sigma-delta modulator comprises a clock input that is coupled to the reference frequency input of the modulator arrangement; and
a synchronization unit coupled between an output of the digital filter and an input of the sigma-delta modulator.

2. The two-point modulator arrangement as claimed in claim 1, further comprising an adding node coupled between the phase comparator and the controlled oscillator, the adding node comprising a first input coupled to the output of the phase comparator, and a second input coupled to the output of the digital signal processor.

3. The two-point modulator arrangement as claimed in claim 2, further comprising an analog filter connected between the output of the digital signal processor and the second input of the adding node, wherein the analog filter is configured to convert the digital modulation data into an analog modulation signal.

4. The two-point modulator arrangement as claimed in claim 2, further comprising a series circuit comprising a charge pump and a loop filter connected between the output of the phase comparator and the first input of the adding node.

5. The two-point modulator arrangement as claimed in claim 1, wherein the digital filter comprises means for pulse shaping the digital modulation data from the digital signal processor.

6. The two-point modulator arrangement as claimed in claim 1, wherein a bandwidth of a phase locked loop which comprises the phase comparator, the controlled oscillator and the frequency divider, is smaller than a bandwidth of the digital modulation data at the output of the digital filter.

7. The two-point modulator arrangement as claimed in claim 1, wherein the frequency generation block comprises a phase locked loop that generates a signal at a frequency that is derived from a reference frequency signal applied to the reference frequency input.

8. A two-point modulator, comprising:
a phase locked loop circuit comprising a first modulation input at a node having a high-pass filter response associated therewith, and comprising a second modulation input at a node having a low-pass filter response associated therewith, wherein the phase locked loop circuit receives a reference frequency signal as an input and outputs a modulated radio frequency signal;
a frequency generation block configured to receive the reference frequency signal and output a substantially constant frequency digital clock signal;
a digital signal processor configured to receive the digital clock signal and generate digital modulation data;
a digital filter configured to receive the digital clock signal and the digital modulation data and provide digital conditioning of the digital modulation data, wherein the digital filter and the digital signal processor are synchronized with respect to one another based on the digital clock signal and operate independently of a frequency of the reference frequency signal;
a sigma-delta modulator coupled between the digital filter and the second node, wherein the sigma-delta modulator comprises a clock input couple to the reference frequency signal, and wherein the sigma-delta modulator receives the conditioned digital modulation data from the digital filter and outputs a control signal to the second node to dictate a fractional rational division ratio over a predetermined period of time; and
a synchronization circuit couple between the digital filter and the sigma-delta modulator, wherein the synchronization circuit is configured to sample the conditioned digital modulation data at a clock rate associated with the reference frequency signal and output the sampled data at a rate associated with the digital clock signal of the frequency generation block,
wherein an analog modulation signal is derived from the digital modulation data and is employed at the first node for analog modulation, and
wherein the phase locked loop circuit further comprises a divider circuit in a feedback loop portion thereof, wherein the divider circuit is configured to receive the control signal at the second node based on the conditioned digital modulation data and modify a frequency of a feedback signal based thereon, wherein the divider circuit is synchronized with respect to the reference frequency signal.

9. A two-point modulator, comprising:
a phase locked loop circuit comprising a first modulation input at a node having a high-pass filter response associated therewith, and comprising a second modulation input at a node having a low-pass filter response associated therewith, wherein the phase locked loop circuit receives a reference frequency signal as an input and outputs a modulated radio frequency signal;
a frequency generation block configured to receive the reference frequency signal and output a substantially constant frequency digital clock signal;
a digital signal processor configured to receive the digital clock signal and generate digital modulation data;
a digital filter configured to receive the digital clock signal and the digital modulation data and provide digital conditioning of the digital modulation data, wherein the digital filter and the digital signal processor are synchronized with respect to one another based on the digital clock signal and operate independently of a frequency of the reference frequency signal;
a sigma-delta modulator coupled between the second node and the digital filter, wherein the sigma-delta modulator comprises a clock input that receives the reference frequency signal; and
a synchronization unit coupled between an output of the digital filter and an input of the sigma-delta modulator,
wherein the conditioned digital modulation data is employed at the second node for digital modulation via the sigma-delta modulator, and
wherein an analog modulation signal is derived from the digital modulation data and is employed at the first node for analog modulation.

* * * * *

UNITED STATES PATENT AND TRADEMARK OFFICE
CERTIFICATE OF CORRECTION

PATENT NO. : 7,502,435 B2  Page 1 of 1
APPLICATION NO. : 10/879431
DATED : March 10, 2009
INVENTOR(S) : Markus Hammes It is certified that error appears in the above-identified patent and that said Letters Patent is hereby corrected as shown below:

Column 5, line 38; Please replace "1 8" with --18--

Column 6, claim 1, line 46; Please replace "oscillator to a second input" with --oscillator and to a second input--

Column 6, claim 1, line 53; Please replace "oscillator; and" with --oscillator;--

Column 7, claim 8, line 50; Please replace "couple" with --coupled--

Column 8, claim 8, line 3; Please replace "couple" with --coupled-

Signed and Sealed this

Twenty-first Day of April, 2009

JOHN DOLL
*Acting Director of the United States Patent and Trademark Office*